(12) United States Patent
Otremba et al.

(10) Patent No.: US 9,922,910 B2
(45) Date of Patent: Mar. 20, 2018

(54) FUNCTIONALIZED INTERFACE STRUCTURE

(71) Applicant: Infineon Technologies Austria AG, Villach (AT)

(72) Inventors: Ralf Otremba, Kaufbeuren (DE); Edward Fuergut, Dasing (DE); Christian Kasztelan, München (DE); Hsieh Ting Kuek, Melaka (MY); Teck Sim Lee, Melaka (MY); Sanjay Kumar Murugan, Melaka (MY); Lee Shuang Wang, Melaka (MY)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/272,037

(22) Filed: Sep. 21, 2016

(65) Prior Publication Data
US 2017/0098598 A1  Apr. 6, 2017

(30) Foreign Application Priority Data

Oct. 2, 2015 (DE) .................. 10 2015 116 807

(51) Int. Cl.
| | |
|---|---|
| *H01L 21/00* | (2006.01) |
| *H01L 23/495* | (2006.01) |
| *H01L 21/48* | (2006.01) |
| *H01L 21/56* | (2006.01) |
| *H01L 23/31* | (2006.01) |

(Continued)

(52) U.S. Cl.
CPC .... *H01L 23/49568* (2013.01); *H01L 21/4825* (2013.01); *H01L 21/4882* (2013.01); *H01L 21/565* (2013.01); *H01L 23/3107* (2013.01); *H01L 23/3114* (2013.01); *H01L 23/36* (2013.01); *H01L 23/4006* (2013.01); *H01L 23/4093* (2013.01); *H01L 23/49562* (2013.01); *H01L 23/49575* (2013.01); *H01L 2224/48091* (2013.01); *H01L 2924/15159* (2013.01); *H01L 2924/181* (2013.01)

(58) Field of Classification Search
CPC ...................................... H01L 21/563
See application file for complete search history.

(56) References Cited

U.S. PATENT DOCUMENTS

| | | | | |
|---|---|---|---|---|
| 4,878,108 A | * | 10/1989 | Phelps, Jr. | .......... H01L 23/4006 257/713 |
| 5,637,920 A | * | 6/1997 | Loo | ....................... H01L 21/563 257/700 |
| 5,886,400 A | | 3/1999 | Letterman, Jr. et al. | |

(Continued)

FOREIGN PATENT DOCUMENTS

| | | |
|---|---|---|
| DE | 19926128 A1 | 12/1999 |
| DE | 10249331 A1 | 5/2004 |

(Continued)

*Primary Examiner* — Thao P Le

(57) ABSTRACT

An electronic component, the electronic component comprising an electrically conductive carrier, an electronic chip on the carrier, an encapsulant encapsulating part of the carrier and the electronic chip, and an electrically insulating and thermally conductive interface structure covering an exposed surface portion of the carrier and a connected surface portion of the encapsulant and being functionalized for promoting heat dissipation via the interface structure on a heat dissipation body.

24 Claims, 5 Drawing Sheets

(51) Int. Cl.
  *H01L 23/36* (2006.01)
  *H01L 23/40* (2006.01)

(56) References Cited

U.S. PATENT DOCUMENTS

| | | | |
|---|---|---|---|
| 6,543,522 B1* | 4/2003 | Hegde | F28F 3/02 |
| | | | 165/185 |
| 9,595,505 B2* | 3/2017 | Chen | H01L 25/0652 |
| 2001/0018235 A1 | 8/2001 | Choi | |
| 2002/0000239 A1* | 1/2002 | Sachdev | C09D 9/00 |
| | | | 134/2 |
| 2002/0012762 A1* | 1/2002 | Bunyan | H01L 23/36 |
| | | | 428/40.2 |
| 2005/0263879 A1 | 12/2005 | Michel et al. | |
| 2007/0230115 A1* | 10/2007 | Dobritz | H01L 23/3675 |
| | | | 361/688 |
| 2008/0188037 A1* | 8/2008 | Lin | H01L 21/4846 |
| | | | 438/108 |
| 2009/0059537 A1 | 3/2009 | MacQuarrie et al. | |
| 2010/0044856 A1* | 2/2010 | Sri-Jayantha | H01L 23/10 |
| | | | 257/717 |
| 2012/0020028 A1* | 1/2012 | Bachman | H01L 23/3677 |
| | | | 361/719 |
| 2013/0252381 A1 | 9/2013 | Spann et al. | |
| 2015/0102479 A1* | 4/2015 | Fuergut | H01L 21/4871 |
| | | | 257/706 |
| 2015/0380387 A1* | 12/2015 | Ben Jamaa | H01L 25/0655 |
| | | | 257/713 |
| 2016/0293528 A1* | 10/2016 | Otremba | H01L 23/49562 |

FOREIGN PATENT DOCUMENTS

| | | |
|---|---|---|
| DE | 102005013763 A1 | 10/2006 |
| DE | 102012018943 A1 | 3/2014 |
| DE | 102013216003 A1 | 6/2014 |
| DE | 1020132016003 A1 | 6/2014 |
| DE | 102014100282 A1 | 7/2014 |
| DE | 102014100309 A1 | 7/2014 |
| DE | 102013220880 A1 | 4/2015 |
| EP | 0671766 A1 | 9/1995 |
| EP | 2365522 A1 | 9/2011 |

* cited by examiner

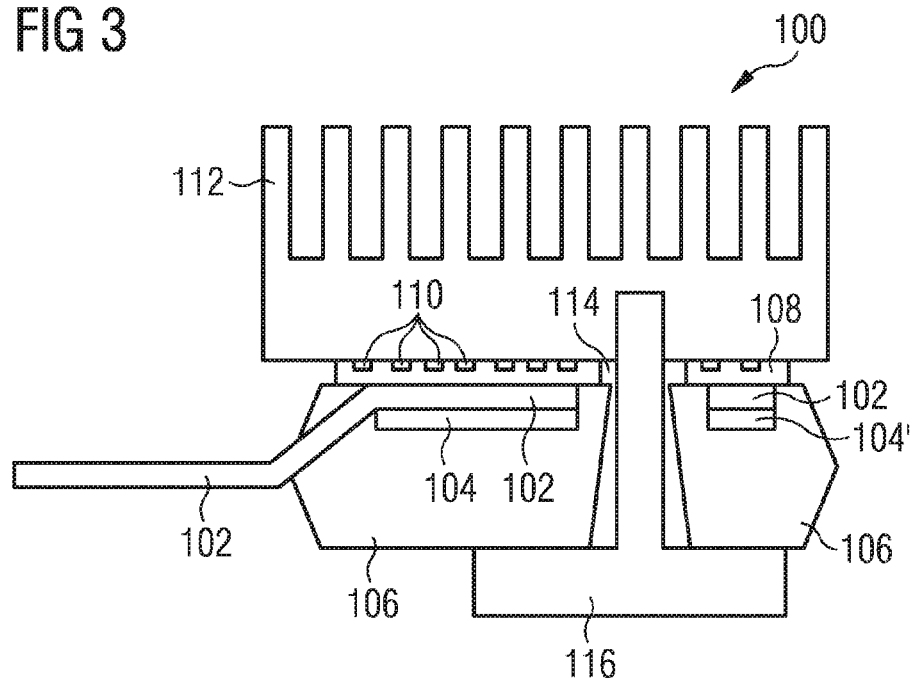
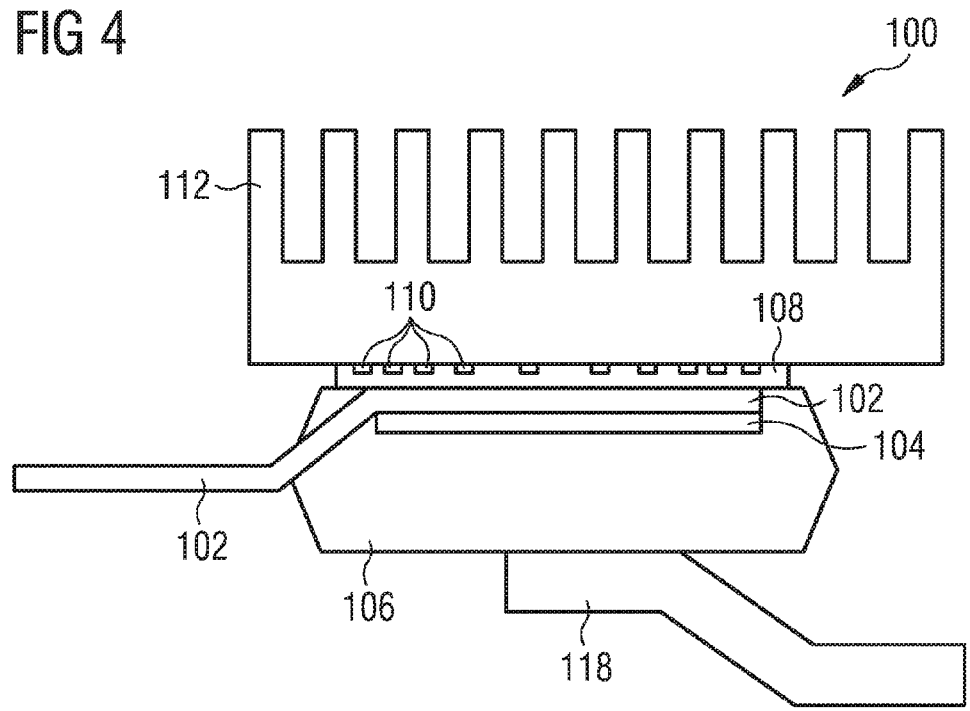

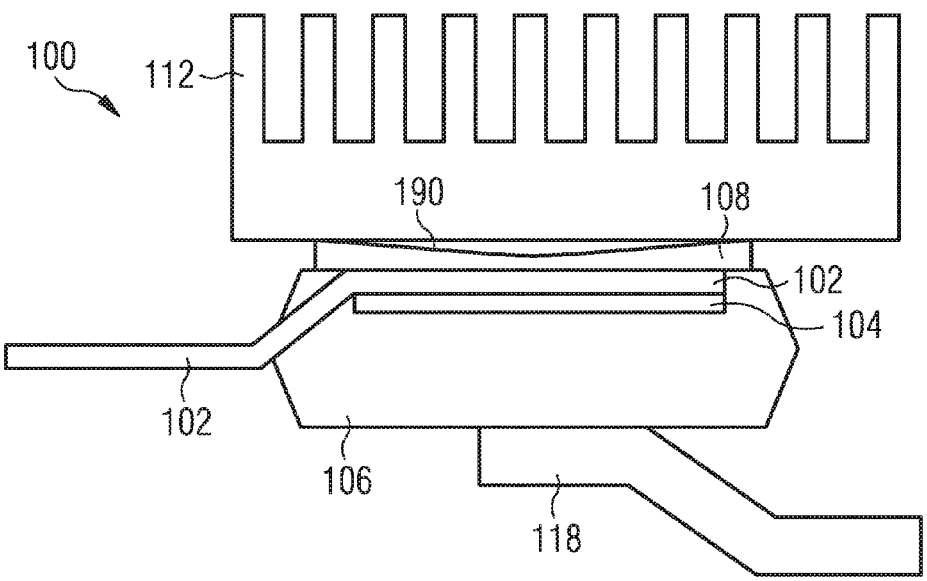
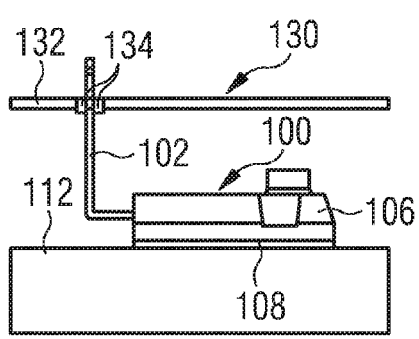
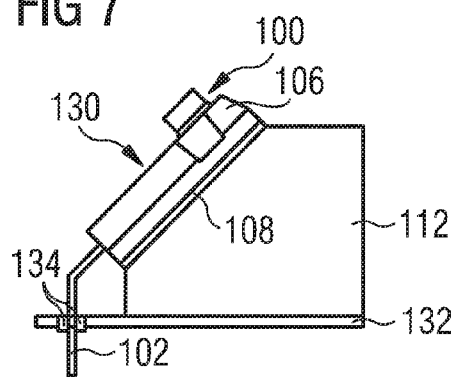
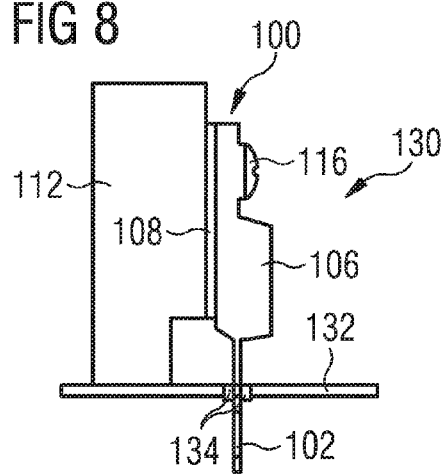
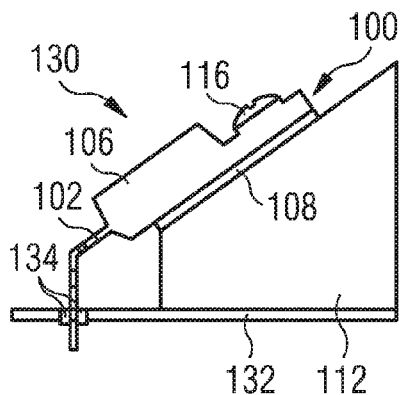

FUNCTIONALIZED INTERFACE STRUCTURE

BACKGROUND

Technical Field

Various embodiments relate generally to electronic components, a method of manufacturing an electronic component, and an arrangement. In particular, exemplary embodiments may promote heat dissipation, and may be implemented in particular in power devices.

Description of the Related Art

Conventional packages, such as mold structures, for electronic chips have evolved to a level where the package no longer significantly impedes the performance of the electronic chips. Such electronic chips can be mounted on a leadframe, and an opposing main surface of the electronic chips may be connected to the leadframe by a bond wire.

A conventional electronic chip mounted on a chip carrier such as a leadframe, electrically connected by a bond wire extending from the chip to the chip carrier, and molded within a package may suffer from its thermal insulation within the package.

DE 10 2013 220 880 A1 discloses a method for manufacturing an electronic semiconductor package, in which method an electronic chip is coupled to a carrier, the electronic chip is at least partially encapsulated by means of an encapsulation structure having a discontinuity, and the carrier is partially encapsulated, and at least one part of the discontinuity and a volume connected thereto adjoining an exposed surface section of the carrier are covered by an electrically insulating thermal interface structure, which electrically decouples at least one part of the carrier with respect to its surroundings.

However, there is still room for improving electronic components in terms of reliability and heat management.

SUMMARY

There may be a need to provide a possibility to manufacture electronic devices with a simple processing architecture and with a high reliability.

According to an exemplary embodiment, an electronic component is provided which comprises an electrically conductive carrier, an electronic chip mounted on the carrier, an encapsulant encapsulating part of the carrier and the electronic chip, and an electrically insulating and thermally conductive interface structure (for instance covering an exposed surface portion of the carrier (in particular uninterruptedly covering an entire surface portion of the carrier exposed at one of two opposing main surfaces of the encapsulant) and a connected surface portion of the encapsulant) being functionalized for promoting heat dissipation/heat transmission via a heat dissipation body and/or for promoting adherence (and/or cohesion and/or contact) of the interface structure on a heat dissipation body (wherein the heat dissipation body may or may not form part of the electronic component).

According to another exemplary embodiment of the invention, an electronic component is provided which comprises an electrically conductive carrier, an electronic chip mounted on the carrier, a further electronic chip mounted on the carrier, an encapsulant encapsulating part of the carrier, the electronic chip and the further electronic chip, and an electrically insulating and thermally conductive interface structure covering an exposed surface portion of the carrier and a connected surface portion of the encapsulant, wherein the interface structure is functionalized by providing a first portion thereof on the electronic chip with a first thickness and by providing a second portion thereof on the further electronic chip with a second thickness, which differs from the first thickness.

According to yet another exemplary embodiment, an arrangement is provided which comprises a mounting structure comprising an electric contact, and an electronic component having the above-mentioned features and mounted on the mounting structure so that the electronic chip is electrically connected to the electric contact.

According to another exemplary embodiment, a method of manufacturing an electronic component is provided, wherein the method comprising mounting an electronic chip on an electrically conductive carrier, encapsulating part of the carrier and the electronic chip by an encapsulant, forming an electrically insulating and thermally conductive interface structure to cover an exposed surface portion of the carrier and a connected surface portion of the encapsulant, and functionalizing the interface structure for promoting adherence of the interface structure on a heat dissipation body.

According to yet another exemplary embodiment, an electronic component is provided which comprises an electrically conductive carrier, an electronic chip on the carrier, an encapsulant encapsulating part of the carrier and the electronic chip, and a heat dissipation body comprising an electrically insulating and thermally conductive interface structure attached or to be attached to an exposed surface portion of the carrier and a connected surface portion of the encapsulant for dissipating heat generated by the electronic chip during operation of the electronic component, wherein the interface structure is functionalized for promoting adherence of the interface structure (in particular to the remainder of the heat dissipation body and/or to the encapsulated chip and carrier).

An exemplary embodiment has the advantage that a reliability of the thermal coupling between the electrically conductive carrier and a heat dissipation body via the thermal interface structure can be significantly improved by specifically functionalizing the thermal interface structure so that its adherence to the heat dissipation body is improved and a highly undesired air gap between heat dissipation body and thermal interface structure can be safely prevented. Consequently, the interface structure may be specifically processed for ensuring a substantially uninterrupted full surface coupling of the interface structure with regard to a heat dissipation body such as a heat sink. A gist of a corresponding embodiment can be seen in the fact that functionalizing the external surface of the interface structure by adjusting a surface property of the thermal interface structure facing the heat dissipation body allows to prevent air gap formation and to promote thermal coupling between interface structure and heat dissipation body. As a rule of thumb, a heat removal capability of air is only about 5% of the heat removal capability of the material of the interface structure when being properly attached to the heat dissipation body. Promoting heat flow between interface structure and heat dissipation body provides efficient cooling of the electronic chip within the electronic component even in the event of an only moderate thermal conductivity of the encapsulant.

According to another exemplary embodiment, a functionalization of an interface structure can be accomplished by configuring the latter from two (or more) different portions having two (or more) different thicknesses corresponding to two (or more) different electronic chips assigned to the different portions. This particularly improves the electric reliability and performance of the electronic component. In such an electronic component, parasitic capacitances may disturb operation of the electronic component and may be formed by the carrier (which can function similar as a first electrically conductive capacitor plate), by an attached heat dissipation body (which can function similar as a second electrically conductive capacitor plate) and by the interface structure (which can function similar as a dielectric between two capacitor plates). Since the value of a capacitance is indirectly proportional to the thickness of the dielectric, modification of the thickness of the interface structure can be used as a design parameter for functionalizing the electronic component so as to suppress undesired effects of the mentioned parasitic capacitance. For instance, the local thickness of the interface structure may be increased for an electronic chip which frequently switches, to thereby locally decrease the parasitic capacitance, which, in turn, results in a reduction of the electric losses. For another chip for which a static operation is desired over a relatively large portion of a duty cycle, a locally smaller thickness of the interface structure is acceptable and allows to position the latter electronic chip closer to a surface which has a positive impact on the heat removal during its operation. The described measure of functionalizing the interface structure by forming it with locally varying thickness in dependence of positions of related chips can provide an efficient electromagnetic interference (EMI) protection. Hence, an inhomogeneous layer thickness of the interface structure may have a positive impact on the electric and thermal performance of the package.

According to yet another exemplary embodiment of the invention, the functionalization of the interface structure may be arranged on the side of the heat dissipation body rather than on the side of the encapsulated chip/package. In such an architecture, any of the embodiments concerning the functionalized interface structure described in this application may be implemented correspondingly.

The above described embodiments may be freely combined.

DESCRIPTION OF FURTHER EXEMPLARY EMBODIMENTS

In the following, further exemplary embodiments of the electronic components, the method of manufacturing an electronic component, and the arrangement will be explained.

In the context of the present application, the term "functionalized" may particularly denote a specific configuration of the interface structure so that the interface structure can provide one additional predefined function (such as an adherence promoting and/or air gap prevention and/or parasitic capacitance suppressing function). The functionalization may also result in a pressure balancing (a density modulation of the thermal interface structure may result in a pressure adjustment). In such an embodiment, the pressure exerted by a fastening element such as a screw for connecting the electronic component to a heat dissipation body may be spatially balanced or at least partially equilibrated by the functionalized interface structure. Preferably, the functionalization may be accomplished by configuring shape, dimension, material and/or any other physical parameter of the interface structure to specifically configure the latter to fulfill the mentioned function.

In the context of the present application, the term "promoting adherence of the interface structure on a heat dissipation body" may particularly denote that the functionalization of the interface structure on a main surface thereof facing the heat dissipation body is configured to suppress any tendency of the interface structure to separate or release from the heat dissipation body. A correspondingly configured interface structure may therefore ensure a substantially void-free interface between interface structure and heat dissipation body.

In an embodiment, the functionalized interface structure is functionalized for disabling formation of a gas inclusion between the interface structure on the one hand and the heat dissipation body on the other hand. More specifically, the functionalized interface structure may be provided with a non-planar surface profile (see in particular reference numerals 110, 188, 190, 192, 1002) for disabling or suppressing formation of thermally poorly conductive gas inclusions. In such an embodiment, the functionalization may be performed in a way that gas present at an interface between interface structure and heat dissipation body is forced to leave this interface region upon connecting heat dissipation body and interface structure. This improves the capability of the electronic component to dissipate heat generated by the at least one electronic chip during operation towards the heat dissipation body and the environment.

In an embodiment, the functionalized interface structure is provided with a surface profile on a main surface facing a heat dissipation body, which surface profile comprises a central protrusion surrounded by a surrounding section with a smaller thickness than in the central protrusion. The central protrusion may laterally extend further than an extension of the electronic chip (for instance in a way that a 45° angle is formed between a connection line of a lateral end of the electronic chip and a lateral end of the central protrusion and a normal direction to the surface of the interface structure facing carrier and the encapsulant). Consequently, a heat spreading angle may be in a range between 30° to 60°, in particular at or around 45°. The central protrusion may experience an increased deformation and mounting pressure as compared to the retracted surrounding section. Such a surface profile may further improve the heat dissipation/heat removal. Such a lateral projecting central area of the interface structure arranged directly beneath the electronic chip may improve the heat removal capability. Such regions are stronger compressed during mounting a heat dissipation body (in particular using a fastening element such as a screw) and therefore have a reduced heat resistance. This is advantageous in particular in view of the fact that the pressing force of a fastening element (for instance a plastic screw) can be limited.

In an embodiment, a functionalized surface of the interface structure defines a thermal coupling surface to face a heat dissipation body to be coupled to the interface structure and opposing an interior surface of the interface structure facing the carrier and the encapsulant. In other words, specifically the exposed exterior surface of the interface structure to be coupled to the heat dissipation body can be functionalized, shaped or activated so as to promote adherence between this activated surface and the heat dissipation body. Air gaps or air bubbles deteriorating the thermal coupling can thereby be removed or kept away from the interface between interface structure and heat dissipation body.

In an embodiment, the functionalized interface structure may accomplish a lateral improved heat transfer.

In an embodiment, the functionalized interface structure has at least one of a concave external surface portion, and a convex external surface portion. A concave external surface of the interface structure is an example for an appropriate functionalization and may act in a similar way as a suction cup and may thereby improve adherence between interface structure and heat dissipation body. The tendency of formation of air gaps can be strongly suppressed by taking this measure. A concave shape of an exposed surface of the interface structure can be particularly advantageous when connecting the interface structure to a heat dissipation body by a fastening element such as a screw (in particular for accomplishing pressure balancing due to asymmetrical screw forces). When using multiple fastening elements (such as two screws) for connecting an electronic component to a heat dissipation body also a convex external surface may be appropriate, or an alternating sequence of convex and concave sections. A convex shape of an exposed surface of the interface structure can also be particularly advantageous when connecting the interface structure to a heat dissipation body by a clip.

In an embodiment, the functionalized interface structure is a patterned layer. One or more recesses of the patterned layer may preferably face the heat dissipation body to be connected to the interface structure. By a corresponding shaping of the patterned layer, proper adherence between the interface structure and the heat dissipation body may be promoted efficiently.

In an embodiment, the patterned layer has one or more air discharge channels configured for discharging air away from an interface between the interface layer on the one hand and the heat dissipation body on the other hand. Such an air discharge channel may guide air away from an interface between interface structure and the dissipation body upon connecting them with one another. Air from the surrounding atmosphere may hence flow away from this interface via the one or more air discharge channels towards an environment. Even an interconnected network of discharge channels can be formed by patterning a layer-type interface structure.

In an embodiment, the interface structure may be defined and/or designed to provide one or more precisely defined air gaps. When an air gap is accurately defined by the interface structure (rather than being formed in an arbitrary manner), reproducibility concerning performance of manufactured electronic components may be improved.

In an embodiment, the patterned layer is configured for providing an electromagnetic interference (EMI) protection. Such a patterning may result in a thickness variation of the interface structure which allows to suppress influences of parasitic capacitances in sections of the electronic component in which parasitic capacitances are particularly disturbing in terms of performance deterioration (for instance in a direct environment of an electronic chip embodied as a high-frequency switch). Consequently, electric losses may be reduced.

In an embodiment, the patterned layer is patterned in accordance with at least one of the group consisting of a honeycomb pattern (i.e. in accordance with a hexagonal geometry), and a polygonal pattern (for instance as an arrangement of interconnected rectangles, in particular squares). Such an architecture suppresses voids and allows gas to escape from the interface between interface structure and heat dissipation body. Thereby, large volume gas inclusions can be prevented.

In an embodiment, the functionalized interface structure comprises at least one blind hole in the interface structure, which the at least one blind hole opens towards a surface to be connected to a heat dissipation body, whereas the interface structure remains closed at an opposing surface covering the exposed surface portion of the carrier and the connected surface portion of the encapsulant. Thus, air gap prevention by air removal through one or more channels defined by the at least one blind hole may be limited to the main surface of the interface structure opposing the heat dissipation body without any undesired impact on the (for instance planar) opposing main surface of the interface structure on the carrier and the encapsulation.

In an embodiment, the functionalized interface structure has a plasma treated external surface. Correspondingly, the method may further comprise plasma treating an external surface of the interface structure. By such a plasma activation of the functionalized surface of the interface structure, a microscopic roughening of this surface may be accomplished which increases the connection area and therefore has a positive impact on the adherence capability of the exposed surface of the interface structure. The mentioned microscopic roughening structure may have an order of magnitude in a range between nanometers and micrometers.

In an embodiment, the mounting structure of the arrangement comprises a printed circuit board (PCB). Hence, free ends of the carrier extending beyond the encapsulant (such as leads of a leadframe extending beyond the encapsulant) may be coupled to electrically conductive structures of the PCB.

In an embodiment, the electronic component further comprises a further electronic chip mounted on the carrier and at least partially encapsulated by the encapsulant, wherein the functionalized interface structure has a first portion with a first thickness on the electronic chip and has a second portion with a second thickness, which differs from the first thickness, on the further electronic chip. By locally adjusting thickness of the interface structure, a trade-off between local parasitic capacitance and distance of carrier and the electronic chip from the surface of the electronic component can be made. Preferably, an external surface of the interface structure facing the heat dissipating body may be planar even in the presence of sections of the interface structure of different thicknesses, to thereby simplify mounting of the heat dissipation body. In order to nevertheless provide sections of different thicknesses, the corresponding height profile of the interface structure may face towards an interior of the encapsulant. Forming different portions of the interface structure with different thicknesses can for instance be advantageous in case of half bridges in which different chip switches are operated with significantly different dynamic loads. More generally, local thickness of the interface structure may be made dependent on at which position a respective electronic chip is positioned. This may allow to avoid or limit performance losses which may occur particularly in the event of high operation frequency values of the electronic chip (for instance above 100 kHz) and/or high-voltage values flowing through the electronic chip during operation (for instance above 800 V).

In an embodiment, a through hole extends at least through the encapsulant and the interface structure so that a fastening element (such as a screw or a bolt) is guidable through the through hole for fastening the electronic component to a heat dissipation body. In an embodiment, the fastening element may form part of the electronic component. Mounting the electronic component to the heat dissipation body by a fastening element such as a screw is simple and cheap.

In an embodiment, a thickness of the functionalized interface structure in a region directly surrounding the through hole is smaller than another thickness of the interface structure in another region located further away from the through hole. A corresponding functionalization in form of a locally reduced thickness of the interface structure around the through hole has the advantage of a very reliable and efficient suppression of the formation of undesired gaps around a through hole. Close to the through hole, the fastening force exerted by the fastening element to the encapsulated chip including interface structure and carrier is very high. Locally thinning the interface structure close to the through hole has turned out as an efficient measure to obtain a uniform interface structure after completing the fastening procedure and without the tendency of formation of air gaps.

In an embodiment, the electronic component comprises a clip configured for connecting the electronic component to a heat dissipation body. Such a clip may be configured to clamp the encapsulated chip-carrier arrangement with thermal interface coating against the heat dissipation body without the need to form a through hole. Although the effort for connecting a heat dissipation body to the rest of the electronic component by a clip is somewhat higher than by a fastening element such as screw, it is nevertheless advantageous in particular for high-performance applications. In an embodiment involving a clip, it has turned out advantageous to form the interface structure with a convex surface facing the heat dissipation body. With such a configuration, the convex surface deforms into a substantially planar surface upon applying pressure with the clip, thereby ensuring an air gap free full surface contact between interface structure and the dissipation body.

In an embodiment, the electronic component comprises neither a fastening element (such as screw) nor a clip. In such an embodiment, it is possible to configure the functionalization of the interface structure so as to provide the adhering function to a heat dissipation body by itself. Clips or screws may thus be eliminated.

In one embodiment, the interface structure is already formed with the functionalization during formation of the interface structure, for instance by compression molding. More specifically, the surface profile of the interface structure may be defined by a profile of a mold and/or by the structure or profile of a release foil (such as a mold release tape).

Alternatively, it is possible to firstly form a conformal interface layer with a homogeneous thickness, and to subsequently further process the interface layer (for instance by etching, laser processing, etc.) to thereby form the functionalization later.

The interface structure may be a foil to be connected to the rest of the electronic component by lamination. Alternatively, it is possible to form the interface structure by molding or deposition.

For example, the interface structure may have a thickness in a range between 10 μm and 1000 μm, in particular in a range between 50 μm and 500 μm. For instance, thermal conductivity of the material of the interface structure may be in a range between 1 W m$^{-1}$ K$^{-1}$ and 20 W m$^{-1}$ K$^{-1}$, in particular in a range between 3 W m$^{-1}$ K$^{-1}$ and 8 W m$^{-1}$ K$^{-1}$. Thermal conductivity of the material of the interface structure may be higher than thermal conductivity of the material of the encapsulant. For instance, thermal conductivity of the material of the encapsulant may be in a range between 0.6 W m$^{-1}$ K$^{-1}$ and 6 W m$^{-1}$ K$^{-1}$, in particular in a range between 1 W m$^{-1}$ K$^{-1}$ and 2 W m$^{-1}$ K$^{-1}$. For example, the material of the interface structure may be a silicone-based material (or may be made on the basis of any other resin-based material, and/or combinations thereof) which may comprise filler particles for improving thermal conductivity. For example, such filler particles may comprise or consist of aluminum oxide (and/or boron nitride, aluminum nitride, diamond, silicon nitride).

In an embodiment, the carrier comprises or consists of a leadframe. A leadframe may be a metal structure inside a chip package that is configured for carrying signals from the electronic chip to the outside, and/or vice versa. The electronic chip inside the package or electronic component may be attached to the leadframe, and then bond wires may be provided for attach pads of the electronic chip to leads of the leadframe. Subsequently, the leadframe may be moulded in a plastic case or any other encapsulant. Outside of the leadframe, a corresponding portion of the leadframe may be cut-off, thereby separating the respective leads. Before such a cut-off, other procedures such a plating, final testing, packing, etc. may be carried out, as known by those skilled in the art.

In an embodiment, the electronic component further comprises the above-mentioned heat dissipation body attached or to be attached to the interface structure for dissipating heat generated by the electronic chip during operation of the electronic component. For example, the heat dissipation body may be a plate of a properly thermally conductive body, such as copper or aluminium or graphite, diamond, composite material and/or combinations of the mentioned and/or other materials, which may have cooling fins or the like to further promote dissipation of heat which can be thermally conducted from the electronic chip via the chip carrier and the interface structure to the heat dissipation body. The removal of the heat via the heat dissipation body may further be promoted by a cooling fluid such as air or water (more generally a gas and/or a liquid) which may flow along the heat dissipation body externally of the electronic component.

In an embodiment, the electronic component is adapted for double-sided cooling. For example, a first functionalized interface structure may thermally couple the encapsulated chip and carrier with a first heat dissipation body, whereas a second functionalized interface structure may thermally couple the encapsulated chip and carrier with a second heat dissipation body.

In an embodiment, the electronic chip is configured as a power semiconductor chip. Thus, the electronic chip (such as a semiconductor chip) may be used for power applications for instance in the automotive field and may for instance have at least one integrated insulated-gate bipolar transistor (IGBT) and/or at least one transistor of another type (such as a MOSFET, a JFET, etc.) and/or at least one integrated diode. Such integrated circuit elements may be made for instance in silicon technology or based on wide-bandgap semiconductors (such as silicon carbide, gallium nitride or gallium nitride on silicon). A semiconductor power chip may comprise one or more field effect transistors, diodes, inverter circuits, half-bridges, full-bridges, drivers, logic circuits, further devices, etc.

In an embodiment, the electronic chip experiences a vertical current flow. The package architecture according to exemplary embodiments of the invention is particularly appropriate for high power applications in which a vertical current flow is desired, i.e. a current flow in a direction perpendicular to the two opposing main surfaces of the electronic chip, one of which being used for mounting the electronic chip on the carrier.

In embodiments, the electronic component may be configured as a half bridge, a cascode circuit, a circuit constituted by a field effect transistor and a bipolar transistor being connected in parallel to one another, or a power semiconductor circuit. Therefore, the packaging architecture according to exemplary embodiments is compatible with the requirements of very different circuit concepts.

In an embodiment, the electronic component is configured as one the group consisting of a leadframe connected power module, a Transistor Outline (TO) electronic component, a Quad Flat No Leads Package (QFN) electronic component, a Small Outline (SO) electronic component, a Small Outline Transistor (SOT) electronic component, and a Thin More Outline Package (TSOP) electronic component. Therefore, the electronic component according to an exemplary embodiment is fully compatible with standard packaging concepts (in particular fully compatible with standard TO packaging concepts) and appears externally as a conventional electronic component, which is highly user-convenient. In an embodiment, the electronic component is configured as power module, e.g. molded power module. For instance, an exemplary embodiment of the electronic component may be an intelligent power module (IPM).

As substrate or wafer forming the basis of the electronic chips, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

For the encapsulating, a plastic material or a ceramic material may be used. The encapsulant may comprise an epoxy material. Filler particles (such as silicon oxide particles), for instance for improving thermal conductivity may be embedded in an epoxy-based matrix of the encapsulant.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

In an embodiment, the functionalized interface structure may be provided with an adhesion layer for adhering to the electronic component and/or to the dissipation body. It is possible to equip such an interface structure with a removable protection foil which can be removed prior to adhering the interface structure.

The above and other objects, features and advantages will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments and constitute a part of the specification, illustrate exemplary embodiments.

In the drawings:

FIG. 1 to FIG. 5 illustrate cross-sectional views of electronic components according to exemplary embodiments of the invention.

FIG. 6 to FIG. 9 illustrate cross-sectional views of arrangements according to exemplary embodiments of the invention.

DETAILED DESCRIPTION

Figure 1:
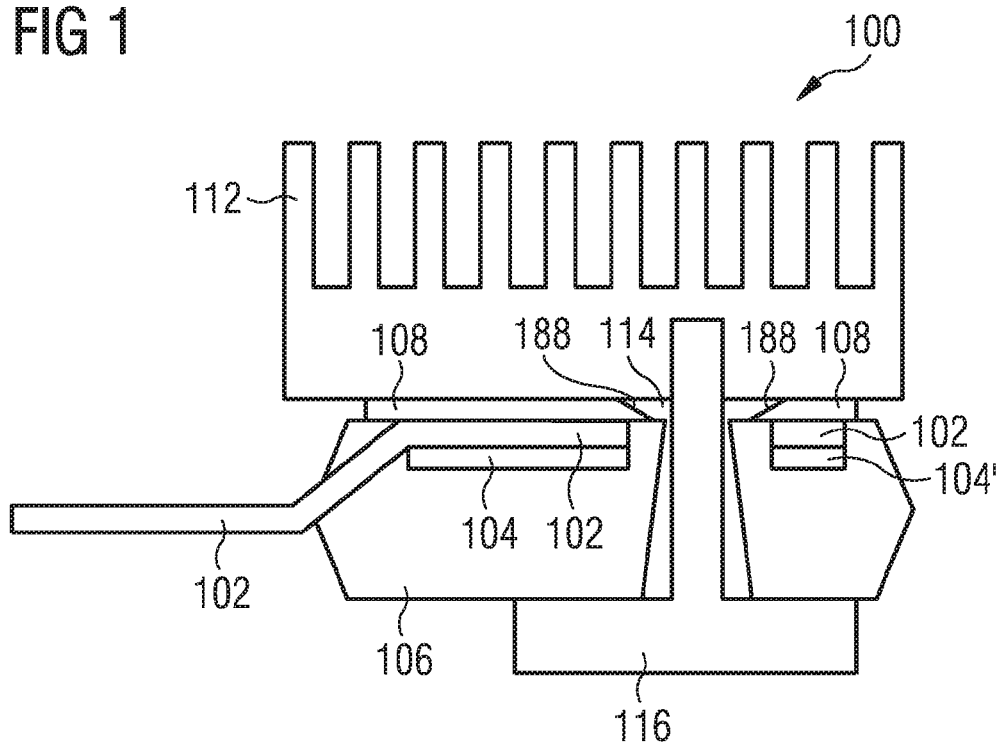

The illustration in the drawing is schematically and not to scale.

Before exemplary embodiments will be described in more detail referring to the figures, some general considerations will be summarized based on which exemplary embodiments have been developed.

According to an exemplary embodiment of the invention, an electronic component or package (for instance a TO-247 package) is provided which is equipped with a structured backside isolation, i.e. a specifically functionalized thermal interface structure (TIM). Correspondingly, in particular power packages like TO packages can be improved regarding thermal-electrical performance of the backside isolation. This provision of a thermal interface structure can be implemented on device (in particular without isolation pad within the application).

For example, such a structured interface structure may be provided with concave shape for improved mounting performance (in particular improved force coupling). Additionally or alternatively, such a structured interface structure may be surface patterned for improved mounting performance (in particular promoting air penetration). It is also possible that a functionalized interface structure according to an exemplary embodiment is plasma-treated for improved mounting performance (in particular for improving heatsink cohesion). Additionally or alternatively, the interface structure may be equipped with a surface pattern for improved EMI behavior (i.e. for improved capacity coupling, in particular suppressing influences of parasitic capacitors within the electronic component). Furthermore, it is also possible to configure the functionalized interface structure with structured shape and heat sink mounting via one or more screws. According to yet another exemplary embodiment of the invention, a functionalized interface structure may be structured and configured for a clip-based mounting on a heat sink.

FIG. 1 illustrates a cross-sectional view of an electronic component 100 according to an exemplary embodiment of the invention which is embodied as a Transistor Outline (TO) electronic component.

The electronic component 100, which can also be denoted as a semiconductor package, comprises an electrically conductive chip carrier 102 which is here embodied as a leadframe. Moreover, an electronic chip 104, which is here embodied as a power semiconductor chip, is mounted on the carrier 102, for instance via an adhesive (not shown). Although not shown in FIG. 1, one or more chip pads of the electronic chip 104 may be electrically coupled with the chip carrier 102 via one or more bond wires (for instance similar as in FIG. 12). An encapsulant 106, for instance a mold compound which may be made of an epoxy-based material with silicon oxide based filler particles, encapsulates a part of the carrier 102. The material of the encapsulant 106 may have a thermal conductivity of approximately 1 W m$^{-1}$ K$^{-1}$ and has electrically insulating properties. However, another part of the carrier 102 extends beyond the encapsulant 106 and is therefore exposed to an environment. Also the electronic chip 104 is encapsulated by the encapsulant 106.

Additionally, a further electronic chip 104', which is here also embodied as a power semiconductor chip, is mounted on the carrier 102, for instance via an adhesive (not shown). Although not shown in FIG. 1, one or more chip pads of the further electronic chip 104' may be electrically coupled with the chip carrier 102 via one or more bond wires (for instance similar as in FIG. 12). The encapsulant 106 also encapsulates the further electronic chip 104'.

In addition, a functionally structured electrically insulating and thermally conductive interface structure 108 is provided which covers an exposed surface portion of the carrier 102 and a connected surface portion of the encapsulant 106 so as to electrically decouple the covered surface of the carrier 102 from an environment. In addition, the interface structure 108 is specifically functionalized for promoting adherence or cohesion of the interface structure 108 on a heat dissipation body 112. The interface structure 108 is a patterned layer with through hole 114 and slanted walls around the through hole 114.

For fastening the electronic component 100 to heat dissipation body 112 (which is here configured as a heat sink with cooling fins), through hole 114 is formed to extend through the encapsulant 106 and the interface structure 108 so that a fastening element 116, here a screw, is guidable through the through hole 114 and into the heat dissipation body 112 for fastening the heat dissipation body 112 to the remainder of the electronic component 100. Consequently, the heat dissipation body 112 is connected with direct contact to the interface structure 108. As a result, heat being generated by the electronic chip 104 during operation of the electronic component 100 can be dissipated via the carrier 102 and the encapsulant 106, and via the interface structure 108 towards the heat dissipation body 112 and from there to the environment.

The interface structure 108 may have a vertical thickness of about 300 μm and may be made of an silicone-based matrix filled with aluminum oxide based filler particles. It may have a thermal conductivity of approximately 5 W m$^{-1}$ K$^{-1}$ and has electrically insulating properties. The interface structure 108 simultaneously fulfils different functions: on the one hand, it covers an exposed surface portion of the carrier 102 as well as adjacent portions of the encapsulant 106 and therefore serves as an electric insulation preventing an electric current from flowing between an interior and an exterior of the encapsulant 106. On the other hand, the interface structure 108 is thermally conductive and allows to conduct thermal energy out of an interior of the encapsulant 106, i.e. from the electronic chips 104, 104' towards an environment. Therefore, the interface structure 108 has also a cooling function.

However, it may conventionally happen that the thermal coupling between the exposed surface of the interface structure 108 on the one hand and the heat dissipation body 112 on the other hand this weakened by the formation of an air gap or air inclusions in an interface region between the interface structure 108 and the heat dissipation body 112. By the specific functional pattern of the interface structure 108 as shown in FIG. 1, the tendency of the formation of an air gap or air inclusions in an interface region between the interface structure 108 and the heat dissipation body 112 can be strongly suppressed: As can be taken from FIG. 1, this can be accomplished by setting a thickness of the functionalized interface structure 108 in a region directly surrounding the through hole 114 smaller than another thickness of the interface structure 108 in another region located further away from the through hole 114. As can be seen in FIG. 1, the through hole 114 protruding through the interface structure 108 has a surface profile in form of a tapering structure 188 (for instance a conically tapering structure) around the through hole 114. As can be taken from FIG. 1 as well, all remaining portions of the interface structure 108 have a constant thickness so that the interface structure 108 is of a conformal layer type in all regions apart from a direct surrounding of the through hole 114. During fastening the heat dissipation body 112 to the remainder of the electronic component 100 by screwing the fastening element 116 (embodied as a screw) through the through hole 114 and into a threaded blind hole of the heat dissipation body 112, a maximum force is applied in the portion of the interface structure 108 in a region directly surrounding the through hole 114. It has turned out that locally thinning the interface structure 108 directly around the through hole 114 by forming the tapering structure 188 results in a substantially planar configuration of the interface structure 108 after the fastening substantially without air gaps between interface structure 108 and heat dissipation body 112. Thus, the functionalization of the interface structure 108 accomplished according to FIG. 1 by the patterning and conically tapering (see tapering structure 188) of the portion of the interface structure 108 delimiting the through hole 114 extending through the interface structure 108 improves adherence and cohesion and therefore thermal coupling between carrier 102, interface structure 108 and heat dissipation body 112.

Figure 2:
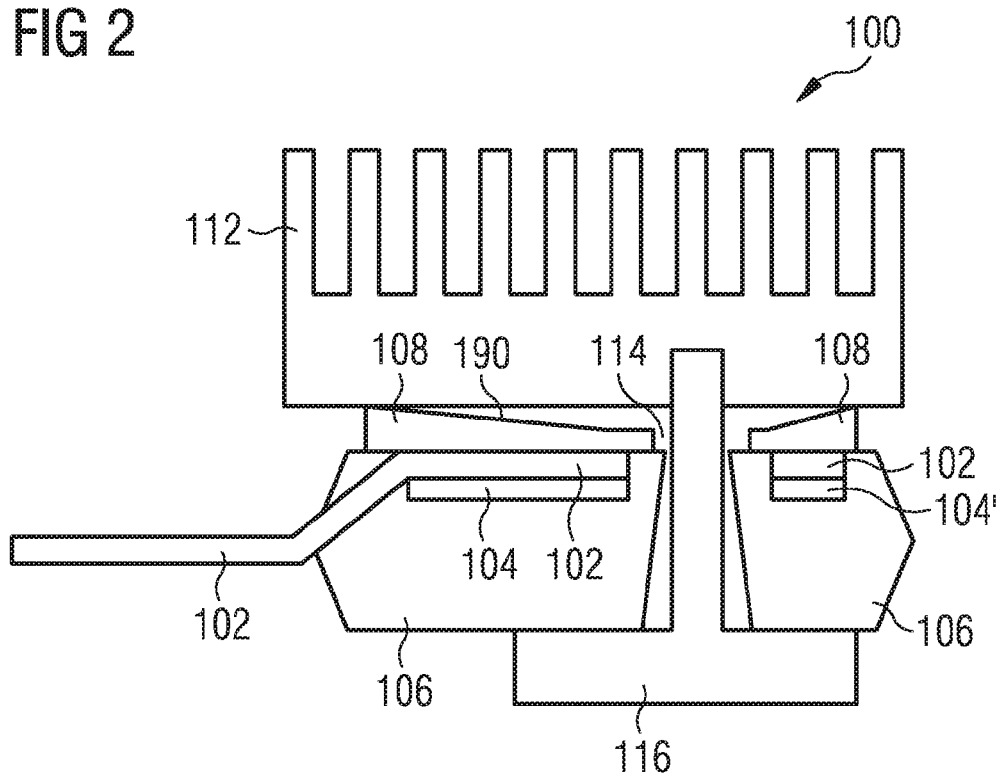

FIG. 2 illustrates a cross-sectional view of an electronic component 100 according to another exemplary embodiment of the invention.

The electronic component 100 according to FIG. 2 differs from the electronic component 100 according to FIG. 1 in particular in that, according to FIG. 2, the interface structure 108 has a surface profile in form of a functionalized concave external surface portion 190 facing the heat dissipation body 112. Upon fastening the fastening element 116 for connecting the heat dissipation body 112 to the remainder of the electronic component 100, the externally concave interface structure 108 functions similar as a suction cup and reliably connects the opposing contact surfaces of the interface structure 108 and the heat dissipation body 112 substantially without air gap in between. Upon fastening the fastening element 116 for connecting the heat dissipation body 112 to the remainder of the electronic component 100, the externally concave interface structure 108 is compressed and slightly deforms into a substantially planar shape (not shown) and is therefore pressed plane-parallel against the heat dissipation body 112 without voids in between. Thus, the functionalized external surface of the interface structure 108 defines a thermal coupling surface to face the heat dissipation body 112 to be coupled to the interface structure 108 and opposing an interior surface of the interface structure 108 facing the carrier 102 and the encapsulant 106. The molded concave TIM shape according to FIG. 2 improves the mounting performance of the electronic component 100.

FIG. 3 illustrates a cross-sectional view of an electronic component 100 according to still another exemplary embodiment of the invention.

The electronic component 100 according to FIG. 3 differs from the electronic component 100 according to FIG. 1 in particular in that, according to FIG. 3, the patterned layer constituting the functionalized interface structure 108 has air discharge channels configured for discharging air away from an interface between the interface structure 108 on the one hand and the heat dissipation body 112 on the other hand. Although not shown in FIG. 3, the patterned interface structure 108 can be preferably patterned in accordance with a honeycomb pattern (i.e. a plurality of interconnected hexagonal channels), since this has turned out as particularly efficient for guiding away air from a central portion of the interface structure 108 to lateral sides thereof. According to FIG. 3, the interface structure 108 has a surface profile in form of a blind hole 110 embodied as a bifurcated network of air channels in the interface structure 108. As can be taken from FIG. 3, the blind hole 110 is open only towards a surface to be connected to the heat dissipation body 112 which is to be fastened to the interface structure 108. The patterned layer remains closed and is therefore continuous at an opposing surface covering an exposed surface portion of the carrier 102 and a connected surface portion of the encapsulant 106. The embodiment of FIG. 3 provides a molded TIM pattern for improved air penetration.

FIG. 4 illustrates a cross-sectional view of an electronic component 100 according to yet another exemplary embodiment of the invention.

The electronic component 100 according to FIG. 4 differs from the electronic component 100 according to FIG. 3 in particular in that, according to FIG. 4, the electronic component 100 comprises a clip 118 (rather than a fastening element 116 in cooperation with a through hole 114) configured for connecting the electronic component 100 to heat dissipation body 112 by clamping. Thus, the chip 104 and the carrier 102 encapsulated by the encapsulant 106 and covered by the interface structure 108 are clamped or pressed against the heat dissipation body 112 by the clip 118. Furthermore, only one chip 104 is foreseen according to FIG. 4.

FIG. 5 illustrates a cross-sectional view of an electronic component 100 according to still another exemplary embodiment of the invention.

The electronic component 100 according to FIG. 5 differs from the electronic component 100 according to Figure in particular in that, according to FIG. 5, the electronic component 100 again comprises a clip 118 (rather than a fastening element 116 in cooperation with a through hole 114) configured for connecting the electronic component 100 to a heat dissipation body 112 by clamping. Furthermore, only one chip 104 is foreseen according to FIG. 5.

FIG. 6 illustrates a cross-sectional view of an arrangement 130 according to an exemplary embodiment of the invention.

The arrangement 130 comprises a mounting structure 132, here embodied as a printed circuit board (PCB), which comprises electric contacts 134 such as a copper wiring. An electronic component 100 which may be configured as described herein is mounted on the mounting structure 132 so that the electronic chip 104 is electrically connected to the electric contact 134 via the chip carrier 102. The interface structure 108, which is not shown in detail in FIG. 6, can hereby be configured as shown in any of FIG. 1 to FIG. 5, FIG. 10 to FIG. 12. According to FIG. 6, main surfaces of the electronic component 100, the mounting structure 132 and the heat dissipation body 112 are parallel to one another.

FIG. 7 illustrates a cross-sectional view of an arrangement 130 according to another exemplary embodiment of the invention. The embodiment of FIG. 7 differs from the embodiment of FIG. 6 in that, according to FIG. 7, the main surfaces of the electronic component 100 are slanted with regard to the main surfaces of the mounting structure 132.

FIG. 8 illustrates a cross-sectional view of an arrangement 130 according to still another exemplary embodiment of the invention. The embodiment of FIG. 8 differs from the embodiment of FIG. 6 in that, according to FIG. 8, the main surfaces of the electronic component 100 are perpendicular to main surfaces of the mounting structure 132.

FIG. 9 illustrates a cross-sectional view of an arrangement 130 according to yet another exemplary embodiment of the invention. The embodiment of FIG. 9 differs from the embodiment of FIG. 6 in that, according to FIG. 9, the main surfaces of the electronic component 100 are slanted with regard to the main surfaces of the mounting structure 132.

Figure 10:
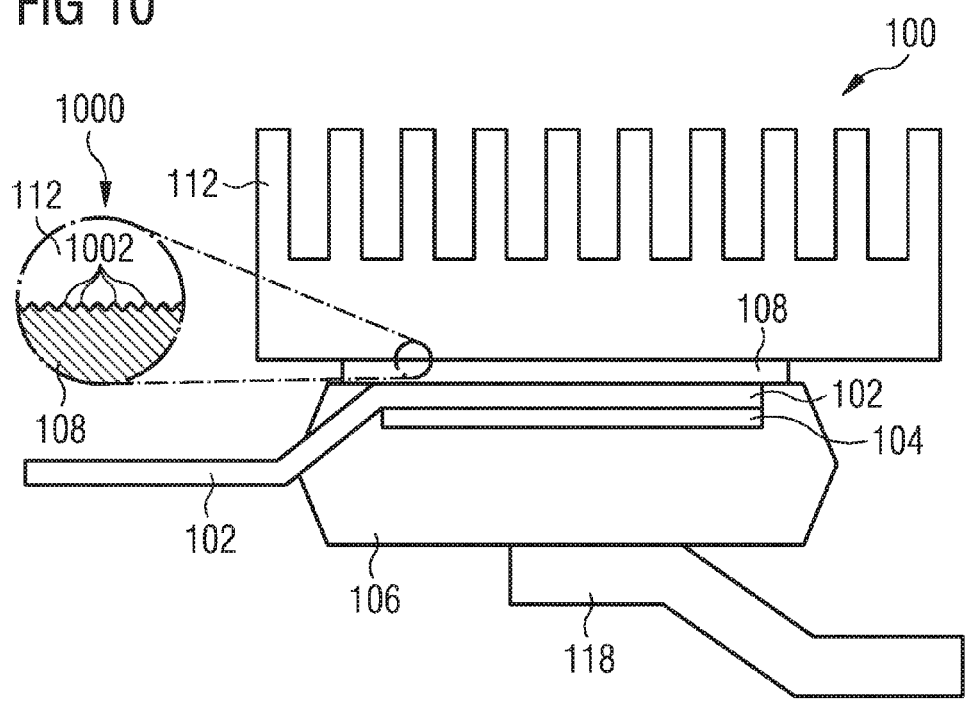
FIG. 10 to FIG. 12 illustrate cross-sectional views of electronic components according to exemplary embodiments of the invention.

FIG. 10 illustrates a cross-sectional view of an electronic component 100 according to another exemplary embodiment of the invention.

The electronic component 100 according to FIG. 10 differs from the electronic component 100 according to FIG. 4 in particular in that, according to FIG. 10, the interface structure 108 is configured as a layer with a substantially conformal or homogeneous thickness. However, the interface structure 108 shown in FIG. 10 has a plasma treated external surface facing the heat dissipation body 112. As can be taken from a detail 1000, the functionalization by plasma treatment results in a surface profile in form of a rough exposed surface of the interface structure 108 comprising a plurality of microprotrusions 1002. The microprotrusions 1002, which may for example have a vertical height of nanometers to micrometers, increase the active surface of the interface structure 108 and therefore promote adherence and air gap free connection to the heat dissipation body 112.

Figure 11:
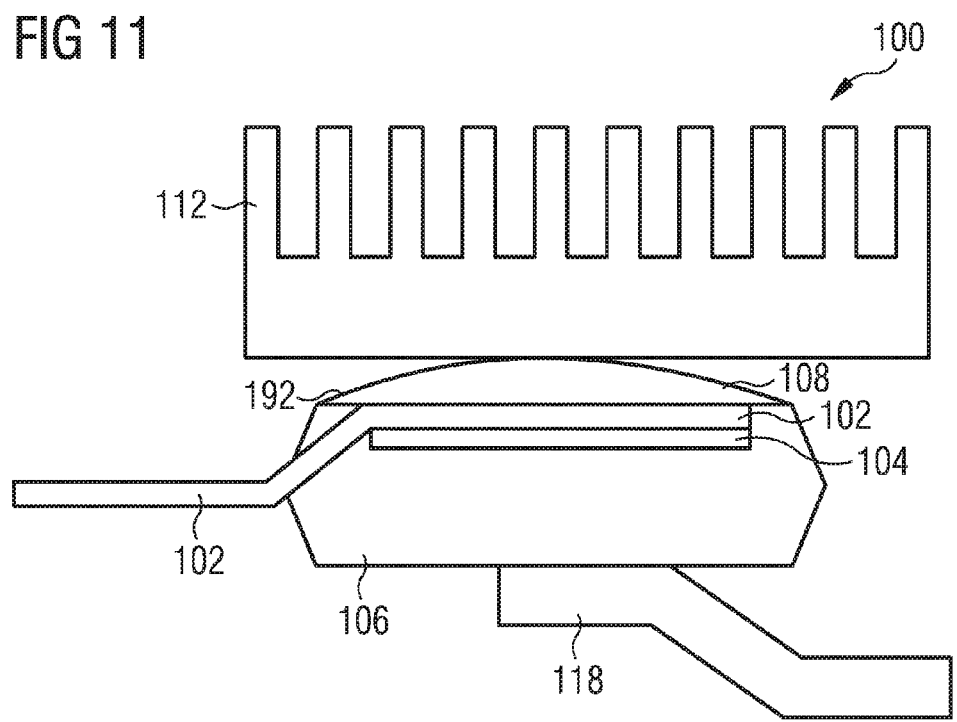

FIG. 11 illustrates a cross-sectional view of an electronic component 100 according to still another exemplary embodiment of the invention.

The electronic component 100 according to FIG. 11 differs from the electronic component 100 according to FIG. 5 in particular in that an exposed surface of the interface structure 108 has a surface profile in form of a convex shape (rather than a concave shape), see convex external surface portion 192. It has turned out that also a convex shape promotes full surface contact between the interface structure 108 and the dissipation body 112, without a pronounced tendency of delamination, separation or formation of voids in between.

Figure 12:
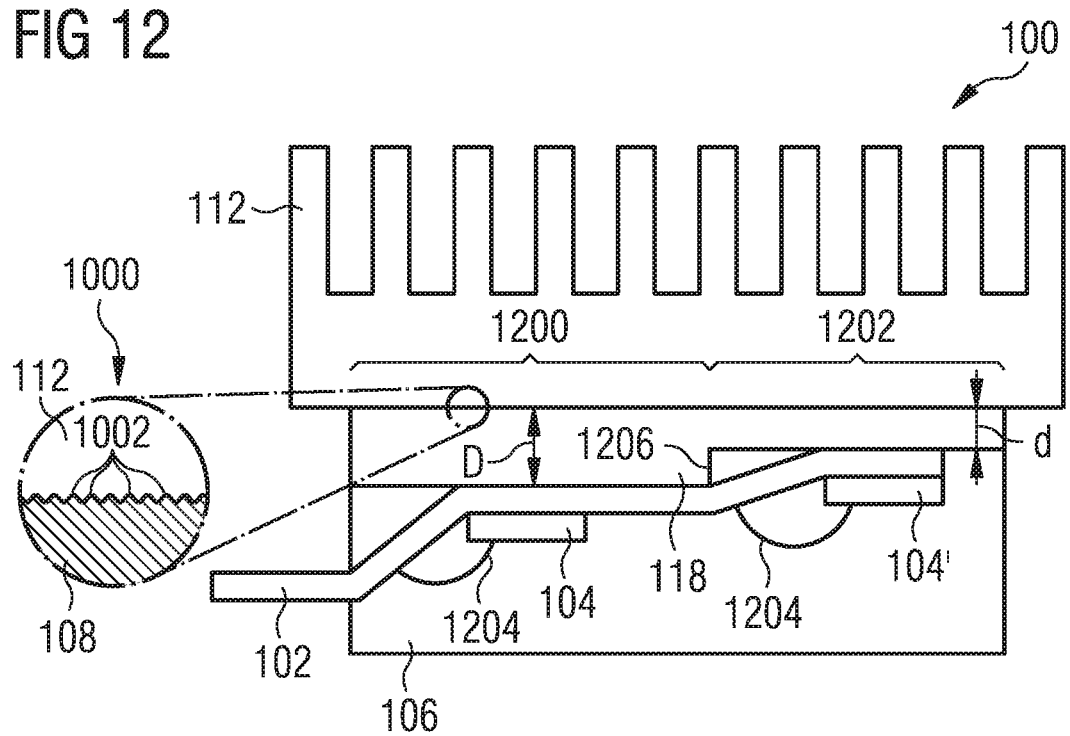

FIG. 12 illustrates a cross-sectional view of an electronic component 100 according to yet another exemplary embodiment of the invention.

According to FIG. 12, chip pads of electronic chip 104 and of further electronic chip 104' are electrically coupled with the chip carrier 102 via bond wires 1204.

The electronic component 100 shown in FIG. 12 comprises an electrically conductive carrier 102 embodied as a bent leadframe, two electronic chips 104, 104' embodied as power semiconductor chips for high-frequency applications on the carrier 102, an encapsulant 106 embodied as a mold compound and encapsulating part of the carrier 102, the electronic chip 104 and the further electronic chip 104', and an electrically insulating and thermally conductive interface structure 108.

According to FIG. 12, the functionalized interface structure 108 covers, at a stepped lower surface thereof (see step 1206), an exposed surface portion of the carrier 102 and a connected surface portion of the encapsulant 106. Another main surface of the interface structure 108, opposing the stepped lower surface thereof, is substantially planar. The interface structure 108 has a first portion 1200 with a first thickness, D, on the electronic chip 104 and has a second portion 1202 with a smaller second thickness, d, on the further electronic chip 104'. In other words, D>d.

By the described configuration, the patterned layer constituting the interface structure 108 is configured for providing an electromagnetic interference (EMI) protection, as will be described in the following. Parasitic capacitances can be formed during operation by the metallic carrier 102, by the metallic heat dissipation body 112 and by the dielectric interface structure 108. The local thickness, D, of the interface structure 108 is locally increased for the electronic chip 104 which frequently switches, to thereby locally increase the parasitic capacitance, which, in turn, results in a reduction of the electric losses. For the further electronic chip 104' for which a static operation is desired over a relatively large portion of a duty cycle, a locally smaller thickness, d, of the interface structure 108 has substantially no performance deteriorating impact and allows to guide the further electronic chip 104' and a corresponding portion of the carrier 102 close to the surface which has a positive impact on the heat removal during operation. The shown configuration can for instance be advantageous in case of a half bridge in which different chip switches (see electronic chips 104, 104') experience different amounts of dynamic load during operation.

Advantageously, the upper exposed surface of the interface structure 108 is macroscopically planar (i.e. has no step 1206) which significantly simplifies connection to the heat dissipation body 112.

As can be taken furthermore from FIG. 12, the upper exposed exterior surface of the interface structure 108 can be optionally functionalized by a plasma treatment, as described referring to FIG. 10, in order to further promote adherence and air gap free connection between the interface structure 108 and the heat dissipation body 112.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. An electronic component, the electronic component comprising:
   an electrically conductive carrier;
   an electronic chip on the carrier;
   an encapsulant encapsulating part of the carrier and the electronic chip;
   an electrically insulating and thermally conductive interface structure being functionalized for promoting heat dissipation via the interface structure on a connectable heat dissipation body;
   wherein the interface structure is functionalized, in particular is provided with a surface profile, for disabling formation of a gas inclusion between the interface structure on the one hand and a connectable heat dissipation body on the other hand.

2. The electronic component according to claim 1, wherein the interface structure covers an exposed surface portion of the carrier and a connected surface portion of the encapsulant.

3. The electronic component according to claim 1, wherein the functionalized interface structure has at least one of a concave external surface portion, and a convex external surface portion.

4. The electronic component according to claim 1, wherein the functionalized interface structure is a patterned layer.

5. The electronic component according to claim 4, wherein the patterned layer has an air discharge channel configured for discharging air away from an interface between the interface layer on the one hand and a connectable heat dissipation body on the other hand.

6. The electronic component according to claim 4, wherein the patterned layer is configured for providing an electromagnetic interference protection.

7. The electronic component according to claim 1, wherein the functionalized interface structure comprises at least one blind hole in the interface structure, which the at least one blind hole opens towards a surface to be connected to a heat dissipation body, whereas the interface structure remains closed at an opposing surface covering the exposed surface portion of the carrier and the connected surface portion of the encapsulant.

8. The electronic component according to claim 1, further comprising:
   a further electronic chip on the carrier and at least partially encapsulated by the encapsulant;
   wherein the functionalized interface structure has a first portion with a first thickness on the electronic chip and has a second portion with a second thickness, which differs from the first thickness, on the further electronic chip.

9. The electronic component according to claim 1, wherein a through hole extends at least through the encapsulant and the interface structure so that a fastening element is guidable through the through hole for fastening the electronic component to a heat dissipation body.

10. The electronic component according to claim 9, further comprising the fastening element, in particular a screw.

11. The electronic component according to claim 9, wherein a thickness of the functionalized interface structure in a region directly surrounding the through hole is smaller than another thickness of the interface structure in another region located further away from the through hole.

12. The electronic component according to claim 1, wherein the functionalized interface structure is configured for spatially balancing pressure exerted when connecting a heat dissipation body using a fastening element.

13. The electronic component according to claim 1, comprising a clip configured for connecting the electronic component to a heat dissipation body.

14. The electronic component according to claim 1, wherein the functionalized interface structure is provided with a surface profile on a main surface facing a heat dissipation body, which surface profile comprises a central protrusion surrounded by a surrounding section with a smaller thickness than in the central protrusion.

15. The electronic component according to claim 1, wherein the electronic component further comprises a heat dissipation body attached or to be attached to the interface structure for dissipating heat generated by the electronic chip during operation of the electronic component.

16. The electronic component according to claim 1, wherein the electronic chip is configured as at least one of the group consisting of:
   a power semiconductor chip; and
   an electronic chip with vertical current flow.

17. The electronic component according to claim 1, configured as one the group consisting of a leadframe connected power module, a Transistor Outline electronic component, a Quad Flat No Leads Package electronic component, a Small Outline electronic component, a Small Outline transistor electronic component, and a Thin More Outline Package electronic component.

18. The electronic component according to claim 1, wherein a functionalized surface of the interface structure defines a thermal coupling surface to face a heat dissipation body to be coupled to the interface structure and opposing an interior surface of the interface structure facing the carrier and the encapsulant.

19. An electronic component, the electronic component comprising:
- an electrically conductive carrier;
- an electronic chip on the carrier;
- a further electronic chip on the carrier;
- an encapsulant encapsulating part of the carrier, the electronic chip and the further electronic chip;
- an electrically insulating and thermally conductive interface structure covering an exposed surface portion of the carrier and a connected surface portion of the encapsulant;
- wherein the interface structure is functionalized by providing a first portion on the electronic chip with a first thickness and by providing a second portion on the further electronic chip with a second thickness, which differs from the first thickness.

20. An arrangement, the arrangement comprising:
- a mounting structure comprising an electric contact;
- an electronic component according to claim 1 mounted on the mounting structure so that the electronic chip is electrically connected to the electric contact.

21. A method of manufacturing an electronic component, the method comprising:
- mounting an electronic chip on an electrically conductive carrier;
- encapsulating part of the carrier and the electronic chip by an encapsulant;
- forming an electrically insulating and thermally conductive interface structure to cover an exposed surface portion of the carrier and a connected surface portion of the encapsulant;
- functionalizing the interface structure for promoting adherence of the interface structure on a heat dissipation body to be connected to the interface structures;
- functionalizing, in particular providing with a surface profile, the interface structure for disabling formation of a gas inclusion between the interface structure on the one hand and a connectable heat dissipation body on the other hand.

22. The method according to claim 21, wherein the functionalizing comprises plasma treating an external surface of the interface structure.

23. The method according to claim 21, wherein the functionalization of the interface structure is defined by a molding procedure.

24. An electronic component, the electronic component comprising:
- an electrically conductive carrier;
- an electronic chip on the carrier;
- an encapsulant encapsulating part of the carrier and the electronic chip;
- a heat dissipation body comprising an electrically insulating and thermally conductive interface structure attached or to be attached to an exposed surface portion of the carrier and a connected surface portion of the encapsulant for dissipating heat generated by the electronic chip during operation of the electronic component;
- wherein the interface structure is functionalized for promoting adherence of the interface structure;
- wherein the interface structure is functionalized, in particular is provided with a surface profile, for disabling formation of a gas inclusion between the interface structure on the one hand and a connectable heat dissipation body on the other hand.

* * * * *